(12) United States Patent
Adusumilli et al.

(10) Patent No.: US 10,446,643 B2
(45) Date of Patent: Oct. 15, 2019

(54) SEALED CAVITY STRUCTURES WITH A PLANAR SURFACE

(71) Applicant: GLOBALFOUNDRIES INC., Grand Cayman (KY)

(72) Inventors: Siva P. Adusumilli, Burlington, VT (US); Anthony K. Stamper, Burlington, VT (US); Laura J. Schutz, Richmond, VT (US); Cameron E. Luce, Colchester, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/876,727

(22) Filed: Jan. 22, 2018

(65) Prior Publication Data

US 2019/0229185 A1   Jul. 25, 2019

(51) Int. Cl.
| H01L 29/06 | (2006.01) |
| H01L 29/49 | (2006.01) |
| H01L 29/51 | (2006.01) |
| H01L 29/78 | (2006.01) |
| H01L 27/12 | (2006.01) |
| H01L 21/84 | (2006.01) |
| H01L 21/762 | (2006.01) |

(52) U.S. Cl.
CPC .... *H01L 29/0653* (2013.01); *H01L 21/76283* (2013.01); *H01L 21/84* (2013.01); *H01L 27/1207* (2013.01); *H01L 29/7841* (2013.01); *H01L 29/4991* (2013.01); *H01L 29/515* (2013.01)

(58) Field of Classification Search
CPC ............. H01L 29/0653; H01L 29/7841; H01L 27/1207; H01L 29/4991; H01L 29/515
See application file for complete search history.

(56) References Cited

U.S. PATENT DOCUMENTS

| 4,888,300 | A | * | 12/1989 | Burton .............. H01L 21/30604 438/404 |
| 5,869,374 | A | | 2/1999 | Wu |
| 5,943,581 | A | * | 8/1999 | Lu ..................... H01L 27/10858 257/E21.65 |
| 5,949,144 | A | * | 9/1999 | Delgado ............. H01L 21/2007 257/226 |
| 6,093,599 | A | | 7/2000 | Lee et al. |

(Continued)

FOREIGN PATENT DOCUMENTS

| JP | 2009099841 | 5/2009 |
| TW | 201711190 | 3/2017 |

OTHER PUBLICATIONS

Response to Office Action in related U.S. Appl. No. 15/645,655, filed Oct. 18, 2018, 12 pages.

(Continued)

*Primary Examiner* — Ida M Soward
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to sealed cavity structures having a planar surface and methods of manufacture. The structure includes a cavity formed in a substrate material and which has a curvature at its upper end. The cavity is covered with epitaxial material that has an upper planar surface.

15 Claims, 8 Drawing Sheets

(56) References Cited

U.S. PATENT DOCUMENTS

| | | | |
|---|---|---|---|
| 6,057,202 A | 9/2000 | Chen et al. | |
| 6,140,197 A | 10/2000 | Chu et al. | |
| 6,255,704 B1 | 7/2001 | Iwata et al. | |
| 6,258,688 B1 | 7/2001 | Tsai | |
| 6,337,499 B1* | 1/2002 | Werner | H01L 29/0634 257/329 |
| 6,376,291 B1* | 4/2002 | Barlocchi | H01L 21/764 257/E21.131 |
| 6,518,144 B2* | 2/2003 | Nitta | H01L 21/76237 438/424 |
| 6,518,147 B1 | 2/2003 | Villa et al. | |
| 6,551,944 B1* | 4/2003 | Fallica | H01L 21/76232 148/33.2 |
| 6,670,257 B1 | 12/2003 | Barlocchi et al. | |
| 6,720,229 B2 | 4/2004 | Norström et al. | |
| 6,835,631 B1 | 12/2004 | Zhen et al. | |
| 6,928,879 B2 | 8/2005 | Partridge et al. | |
| 6,992,367 B2 | 1/2006 | Erratico et al. | |
| 7,009,273 B2 | 3/2006 | Inoh et al. | |
| 7,053,747 B2 | 5/2006 | Joodaki | |
| 7,279,377 B2* | 10/2007 | Rueger | H01L 21/76224 257/E21.546 |
| 7,294,536 B2 | 11/2007 | Villa et al. | |
| 7,326,625 B2* | 2/2008 | Jeong | H01L 21/764 257/E21.022 |
| 7,427,803 B2 | 9/2008 | Chao et al. | |
| 7,662,722 B2 | 2/2010 | Stamper et al. | |
| 7,678,600 B2* | 3/2010 | Villa | B81C 1/00158 257/415 |
| 8,203,137 B2* | 6/2012 | Cho | B82Y 20/00 257/14 |
| 8,319,278 B1* | 11/2012 | Zeng | H01L 29/7809 257/330 |
| 8,575,690 B1* | 11/2013 | Hsieh | H01L 29/407 257/334 |
| 8,652,951 B2 | 2/2014 | Huang et al. | |
| 8,674,472 B2 | 3/2014 | Botula et al. | |
| 8,907,408 B2* | 12/2014 | Sedlmaier | H01L 21/765 257/329 |
| 8,927,386 B2 | 1/2015 | Wu et al. | |
| 9,048,284 B2 | 6/2015 | McPartlin et al. | |
| 9,177,866 B2* | 11/2015 | Davies | H01L 21/76224 |
| 9,224,858 B1 | 12/2015 | Camillo-Castillo et al. | |
| 9,349,793 B2 | 5/2016 | Jaffe et al. | |
| 9,355,972 B2 | 5/2016 | Dunn et al. | |
| 9,640,538 B2* | 5/2017 | Liu | H01L 27/1087 |
| 9,726,547 B2 | 8/2017 | Liu et al. | |
| 9,917,186 B2* | 3/2018 | Laven | H01L 29/4236 |
| 10,062,757 B2* | 8/2018 | Toia | H01L 21/02381 |
| 2002/0043686 A1 | 4/2002 | Bolam et al. | |
| 2002/0195681 A1 | 12/2002 | Melendez et al. | |
| 2004/0180510 A1* | 9/2004 | Ranade | H01L 21/763 438/430 |
| 2004/0217434 A1* | 11/2004 | Lee | H01L 21/76224 257/412 |
| 2004/0217443 A1 | 11/2004 | Davies | |
| 2005/0176222 A1 | 8/2005 | Ogura | |
| 2006/0091453 A1* | 5/2006 | Matsuda | H01L 29/7813 257/330 |
| 2006/0138541 A1* | 6/2006 | Nakamura | H01L 29/66772 257/347 |
| 2006/0228864 A1 | 10/2006 | Chen et al. | |
| 2007/0238250 A1 | 10/2007 | Zhang et al. | |
| 2008/0044979 A1 | 2/2008 | Wells et al. | |
| 2008/0073747 A1 | 3/2008 | Chao et al. | |
| 2009/0072351 A1 | 3/2009 | Meunier-Beillard et al. | |
| 2009/0101997 A1* | 4/2009 | Lammel | G01L 9/0073 257/415 |
| 2010/0035403 A1 | 2/2010 | Brown et al. | |
| 2010/0059854 A1 | 3/2010 | Lin et al. | |
| 2010/0109120 A1 | 5/2010 | Fucsko et al. | |
| 2012/0028401 A1 | 2/2012 | De Munck et al. | |
| 2012/0038024 A1 | 2/2012 | Botula et al. | |
| 2012/0292700 A1 | 11/2012 | Khakifirooz et al. | |
| 2013/0043490 A1* | 2/2013 | Sorada | H01L 21/044 257/77 |
| 2013/0320459 A1 | 12/2013 | Shue et al. | |
| 2014/0042595 A1* | 2/2014 | Schulze | H01L 21/78 257/622 |
| 2014/0097402 A1 | 4/2014 | Wang et al. | |
| 2014/0252481 A1 | 9/2014 | Flachowsky et al. | |
| 2014/0353725 A1* | 12/2014 | Adkisson | H01L 29/737 257/197 |
| 2015/0179755 A1 | 6/2015 | Rooyackers et al. | |
| 2015/0194416 A1 | 7/2015 | Cheng et al. | |
| 2015/0318665 A1* | 11/2015 | Liang | H01S 5/1071 372/34 |
| 2015/0348825 A1 | 12/2015 | Hebert | |
| 2016/0372592 A1 | 12/2016 | Cho | |
| 2017/0110574 A1* | 4/2017 | Laven | H01L 29/4236 |
| 2017/0170056 A1 | 6/2017 | Jaffe et al. | |

OTHER PUBLICATIONS

Hashimoto et al., "A Study on Suppressing Crosstalk Through a Thick SOI Substrate and Deep Trench Isolation", IEEE Journal of Electronic Devices Society, Jul. 2013, vol. 1, No. 7, 7 pages.

Ohguro et al., "High performance digital-analog mixed device on a Si substrate with resistivity beyond 1 kΩ cm", IEEE, Dec. 10-13, 2000, 4 pages.

Taiwanese Office Action in related U.S. Appl. No. 10/613,2441 dated Jul. 16, 2018, 10 pages.

Office Action in related U.S. Appl. No. 15/645,655 dated Jul. 19, 2018, 17 pages.

Final Office Action in related U.S. Appl. No. 15/645,655 dated Jan. 31, 2019, 16 pages.

Office Action in related U.S. Appl. No. 15/703,220 dated Sep. 5, 2018, 27 pages.

Response to Office Action in related U.S. Appl. No. 15/703,220, filed Dec. 5, 2018, 12 pages.

Taiwanese Office Action in related U.S. Appl. No. 10/711,2403 dated Oct. 18, 2018, 9 pages.

Taiwanese Office Action and Search Report in related TW Application No. 106132441 dated Dec. 7, 2018, 14 pages.

Notice of Allowance in related TW Application No. 107112403 dated Mar. 27, 2019, 4 pages.

Response to Final Office Action in related U.S. Appl. No. 15/645,655 dated Mar. 20, 2019, 11 pages.

Final Office Action in related U.S. Appl. No. 15/703,220 dated Mar. 19, 2019, 17 pages.

Taiwanese Office Action in TW Application No. 106132441 dated Jun. 4, 2019, 10 pages.

Response to Final Office Action in U.S. Appl. No. 15/703,220 filed Apr. 25, 2019, 13 pages.

Second Response to Final Office Action in U.S. Appl. No. 15/703,220 filed Jun. 5, 2019, 13 pages.

Notice of Allowance in U.S. Appl. No. 15/645,655 dated Jul. 19, 2019, 9 pages.

* cited by examiner

SEALED CAVITY STRUCTURES WITH A PLANAR SURFACE

FIELD OF THE INVENTION

The present disclosure relates to semiconductor structures and, more particularly, to sealed cavity structures having a planar surface and methods of manufacture.

BACKGROUND

Radio frequency (RF) devices are used in many different types of communication applications. For example, RF devices can be used in cellular telephones with wireless communication components such as switches, MOSFETs, transistors and diodes.

As cellular telephones become more complex and commoditized, there is an increasing need to provide higher performance and lower price points for the wireless communication components. A significant fraction of the cost of manufacturing an RF switch, for example, is the cost to engineer very high linearity such that harmonic distortion is extremely low and meets product specifications.

RF devices are typically manufactured on high resistivity silicon wafers or substrates to achieve the needed RF linearity. State-of-the-art trap rich silicon on insulator (SOI) high resistivity substrates offer excellent vertical isolation and linearity, but the SOI wafer can be up to 50% of the total manufacturing cost because they can be 5 to 10 times the cost of high resistivity non-SOI substrates, i.e., a RF device formed on a SOI wafer could have a total normalized manufacturing cost of 1.0 while a similar device formed on a high resistivity non-SOI bulk wafer could have a total normalized manufacturing cost of 0.6. Devices built on bulk Si substrates have been known to suffer from degraded linearity, harmonics, noise, and leakage currents, any of which will degrade device performance thus necessitating the higher cost of SOI wafers.

SUMMARY

In an aspect of the disclosure, a structure comprises a cavity formed in a substrate material, the cavity being covered with epitaxial material that has an upper planar surface.

In an aspect of the disclosure, a structure comprises: a substrate material; a cavity formed in the substrate which includes a trench having a curved edge portion at its upper end; a first material within the trench which migrates to the upper end of the trench; and a second material which covers the first material and which covers the trench, the second material having a planar surface.

In an aspect of the disclosure, a method comprises: forming a trench in a substrate material; filling a top portion of the trench with a first material; and covering the trench with a second material at a certain temperature such that the first material reflows within the trench forming a cavity within the substrate material which has a shape different than the trench prior to the covering of the trench.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1A:
FIGS. 1A-1I show structures and respective fabrication processes in accordance with aspects of the present disclosure.

The present disclosure relates to semiconductor structures and, more particularly, to sealed cavity structures with a planar surface and methods of manufacture. In embodiments, the cavity structures can be formed from cavities or trenches, sealed with an epitaxial material after an annealing process. Advantageously, the implementation of the present disclosure enables a well-controlled sealing of the trenches (with or without cavities) which provides a substrate cavity while also providing a very planar sealing at the top of the trenches for subsequent fabrication of semiconductor devices.

In embodiments, cavity structures can be formed in bulk silicon wafers with either standard resistivity of 0.1 to 100 ohm-cm or high resistivity silicon wafers, e.g., a resistivity >>1 ohm-cm or about 1 Kohm-cm to about 10 Kohm-cm or higher. In embodiments, the cavity structures are formed under source/drain regions extending to a bottom of a PN junction under gate structures or with the source/drain PN junction bottom above and not touching the cavity. In further embodiments, the cavity structures can be formed with a dual well stack with deep trench isolation structures to avoid depletion region punch through, or in a triple well structure without deep trench isolation structures, amongst other implementations described herein.

In any of the disclosed implementations, the cavity structures can be used with radio frequency (RF) FETs or NPNs, such as FET switches, with the cavity structures under such devices. Also, in any of the disclosed implementations, the trenches leading to the cavity structures are subjected to an optional annealing process prior to being sealed with an epitaxial material. This annealing process will soften the edges of the trenches, making it possible to provide a seal with a planar profile, compared to conventional devices that have a hump, bump or seam. For example, the annealing process will form a curvature at the entrance of the trench, which enables subsequent deposition processes to form a planar sealing surface through reflow. The sealing material can be a combination of SiGe and Si, for example. In embodiments, the SiGe and Si are formed with an epitaxial deposition on the substrate. This planar profile provides the ability to more easily and accurately fabricate devices on top of the cavity structure.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

FIG. 1A shows an incoming structure in accordance with aspects of the present disclosure. In particular, the structure 10 includes a substrate 12. The substrate 12 can comprise an insulator, such as silica glass, quartz, alumina, etc., or a semiconductor, such as Si, GaAs, etc. of any resistivity known in the art. In embodiments, the substrate 12 is composed of crystalline silicon. In another embodiment, the substrate 12 is composed of high resistivity silicon with resistivity in the range of about between 1 Kohm-cm to 10 Kohm-cm, as an illustrative example. It should be recognized that resistivities of 1K ohm-cm and greater are sufficient to significantly reduce substrate induced harmonic distortion and losses. Higher resistivities, though, are also contemplated to 20 Kohm-cm or greater. In embodiments, as described above, the substrate 12 can be composed of any suitable semiconductor materials such as, e.g., Si, SiGe, SiGeC, SiC, GaAs, InAs, InP, and other III/V or II/VI compound semiconductors.

Still referring to FIG. 1A, one or more pad films 15, such as but not limited to, oxide and nitride are deposited on the substrate 12. Alternatively, any combination of conductors, semiconductors, or insulators can be used to form the pad films 15. In embodiments, the nitride can be deposited by a conventional deposition process, e.g., chemical vapor deposition (CVD), to a thickness of about 100 nm to 200 nm; whereas, the oxide can be deposited to a thickness of about to 10 nm. The oxide can be deposited using CVD or other methods known in the art. If the substrate is formed from silicon than the oxide can be formed in furnace oxidizations of the silicon. It should be understood, though, that other dimensions are also contemplated herein.

Figure 1B:
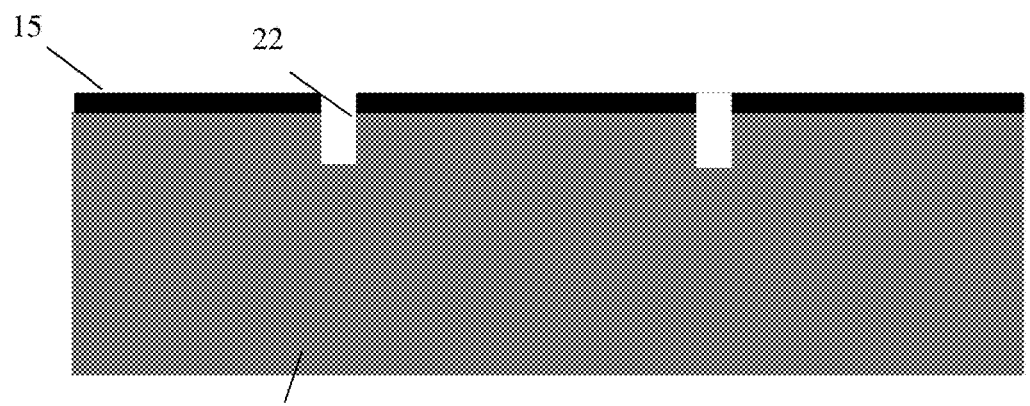

Referring to FIG. 1B, openings or trenches 22 are patterned on the pad dielectric films 15, followed by an etching and trench formation into the substrate 12. The trenches can include "holes" and/or "bars". In embodiments, holes would have 1:1 aspect ratio as seen from above, while bars would have aspect ratios >1:1 as seen from above.

In more specific embodiments, the trenches 22 can be formed by conventional lithography and etching processes. For example, a resist formed over the pad dielectric films 15 is exposed to energy (light) to form a pattern (opening). An etching process with a selective chemistry, e.g., reactive ion etching (RIE), will be used to form one or more trenches 22 through the openings of the resist, through the pad films 15, and into the substrate 12. The resist can then be removed by a conventional oxygen ashing process or other known stripants. The width of the trenches 22 is determined by the lithography resolution. In one illustrative example, the pad films are 100 nm thick, the trenches are 120 nm wide, holes and the trenches are 0.7 micron deep into the substrate 12.

Figure 1C:
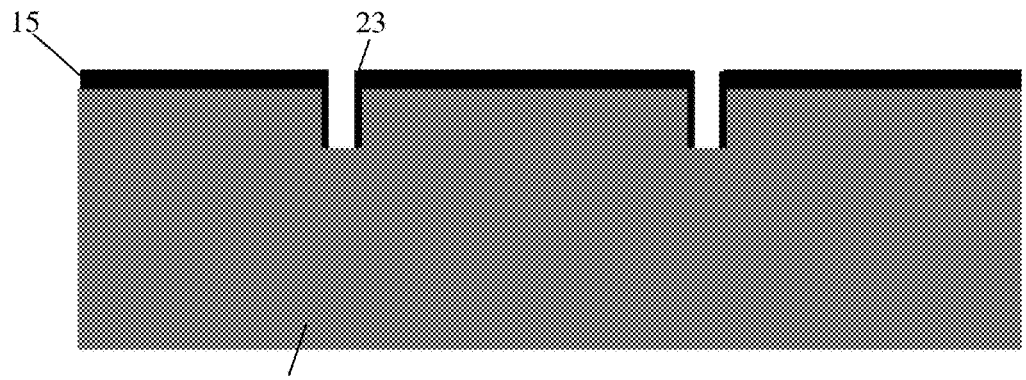

Referring to FIG. 1C, a sidewall liner (also referred to as a spacer) 23 is formed on the sidewalls of the trenches 22 by depositing a dielectric material and anisotropically etching the dielectric material from the bottom and top planar features of the structure. In embodiments, the sidewall liner 23 can be an oxide material, as an example. In embodiments, the oxide could be composed of a combination of a thermal oxidization of the silicon substrate 12 in a furnace followed by a CVD, ALD, or any other known oxide deposition method. In embodiments, the anisotropic etch could consist of a reactive ion etch (RIE) using a perfluorocarbon-based chemistry, as is known in the art, which etches material from planar surfaces but leaves the dielectric material on the sidewall of the trenches 22.

In embodiments, the sidewall liner 23 is one or more of any suitable dielectric materials such as one or more oxide or nitride layers or combination of dielectric layers deposited using any known deposition method, e.g., chemical vapor deposition (CVD), thermal oxidization of the silicon substrate, or atomic layer deposition (ALD) or any of these combinations. The sidewall liner 23 should robustly coat the sidewalls of the trenches 22 in order to protect the underlying substrate material from subsequent etching processes (for cavity formation).

To achieve this robust sidewall coverage, the dielectric material or materials needs to be thick enough to leave a thick film on the sidewalls of the trenches 22 but not too thick that it pinches off the top opening of the trenches 22, which would prevent cavity formation during the successive cavity etch. For example, 40 nm of nitride can be deposited on a 100 nm wide trench. In another embodiment, the sidewall of trenches 22 are thermally oxidized to form a $SiO_2$ layer which extends under the dielectric films 15. Following this thermal oxidization, the sidewall liner 23 can undergo an anisotropic etch. In embodiments, the top surface of pad film 15 is exposed to the spacer etch and is thinned but not fully removed.

Figure 1D:
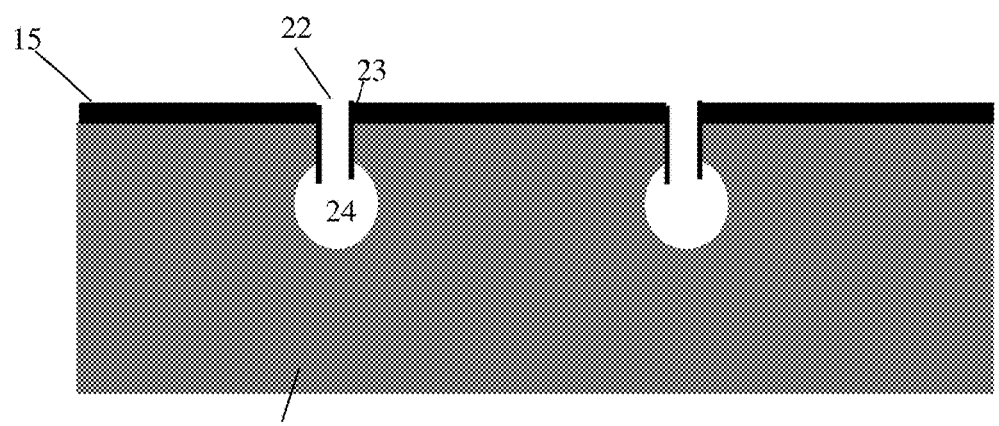

As shown in FIG. 1D, cavity structures 24 are selectively formed in the substrate 12 by a substrate etching process through the bottom of the trenches 22. The pad films 15 on the substrate surface and the spacer films (e.g., sidewall liner) 23 on the side of the trench 22 protect the substrate from being unintentionally etched. In embodiments, an optional vapor or liquid HF treatment, hydrogen plasma, anneal, basic or acidic chemical clean, or any process known to remove thin or native dielectrics or residual spacer etch polymer from the substrate 12 (e.g., silicon) can be used to remove any excessive dielectric at a bottom of the trenches 22 prior to etching the cavity 24. The post sidewall liner etch cleans (e.g., anisotropic etch) should leave a robust dielectric liner 23 on the top corner and sidewall of the trenches 22 to prevent etching of silicon in substrate 12 through the sidewall of the trenches 22 during the cavity formation. If a thermal oxide formed in a furnace for spacer 23 is used, then silicon under the pad films 15 are oxidized, which may provide a better protective barrier to prevent unintentional substrate 12 etching during the cavity 24 formation.

Following the liner or spacer 23 formation and optional clean(s), exposed substrate material at the bottom of the trench 22 can be removed to form a cavity structure 24. To avoid unintentional etching of the substrate 12 on the sidewall of the trenches and top surface of the structure, the pad dielectric material 15 and sidewall liner 23 completely cover the substrate 12. In embodiments, the exposed substrate material 12 can be removed by a wet etching process or dry etching process. For example, dry etchants can include plasma-based $CF_4$, plasma-based $SF_6$, or gas $XeF_4$ silicon etch, etc., and wet etching processes can include KOH and $NH_4OH$. In embodiments, the cavity structures 24 can be formed under what will be the FET source/drain regions extending to a bottom of a PN junction under and between gate structures; under the FET gate; or both. Alternatively, the cavities can be formed under any passive device, such as a silicon diffusion or polysilicon resistor, or active device, such as a FET, SiGe HBT, bipolar junction transistor, MESFET, etc.

In embodiments, the upper surface of cavity structure 24 can be about 300 nm in depth below the substrate 12 top surface; although other dimensions are also contemplated herein. In addition, the cavity structure 24 can have a diameter of about 200 nm to about 800 nm as an example; although other dimensions are contemplated herein. If the cavity is under the source/drain regions of a FET, the cavity may extend to under the gate FET; if the cavity is under the FET gate, then it may extend to under the FET source/drain (e.g., extending partially but not completely under the gate).

Figure 1E:
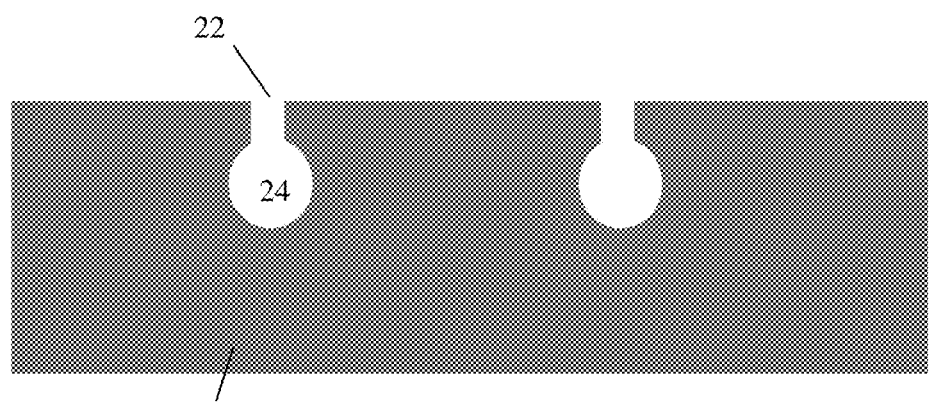

In FIG. 1E, the sidewall liner 23 and pad dielectrics 15 are removed from the structure, exposing the upper surface of the substrate 12 and the sidewalls of the trenches 22. In embodiments, the sidewall liner 23 and pad dielectrics 15 can be removed by a conventional etching process selective to such materials. For example, the sidewall liner 23 and pad dielectrics 15 can be removed by using only or a combination of hot phosphorous followed by an HF chemistry or vice-versa depending on the single dielectric layer or stack of different dielectric layers used for sidewall liner.

Figure 1F:
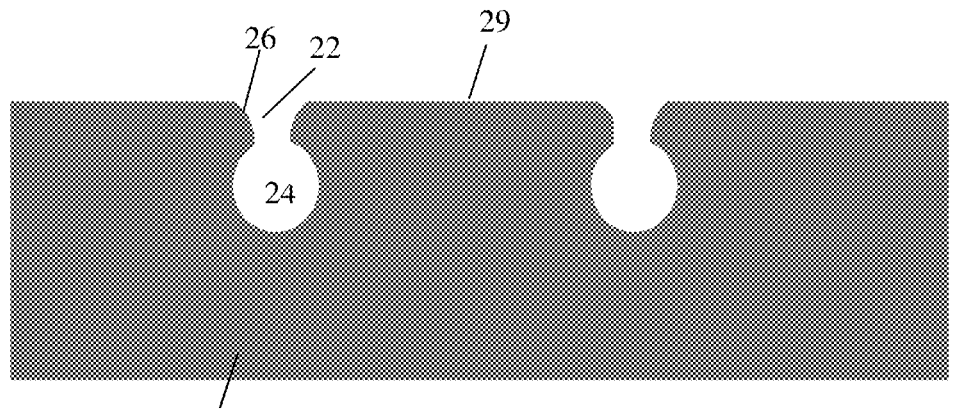

Following the removal of the sidewall liner 23 and pad dielectrics 15, the trenches 22 are subjected to an optional annealing process to soften or round (curve) the edges of the trenches, as shown representatively at reference numeral 26 in FIG. 1F. By way of one example, following an HF preclean process, the structure can undergo an annealing process at a temperature range of about 800° C. to about 1100° C., for up to about 60 seconds. In more specific embodiments, the annealing process can be at a temperature of about 650° C. for 60 seconds. In embodiments, the annealing process can be performed in an $H_2$ atmosphere; although other hydrogen atmospheres are also contemplated herein, e.g., $NH_3$, $B_2H_6$, $Ph_3$, $AsH_2$ or other gases bonded to hydrogen. In embodiments, the annealing in an $H_2$ or other hydrogen atmosphere may remove any native or other oxide from the silicon substrate surface. This annealing process may smooth or reflow the walls of the cavity 24. If little or no curvature 26 is used, then the annealing temperature, time, or hydrogen-based gas flow is reduced to eliminate or minimize the silicon substrate reflow.

In embodiments, the critical dimension between the optionally curved silicon 26 at the top of the trenches 22 can be increased by approximately 30% or more during the anneal. In preferred embodiments, though, the annealing process should increase the critical dimension of the curved silicon 26 at the top of the trenches 22 to about 20%. For example, with a trench opening of 120 nm, the critical dimension of the silicon curvature post annealing can increase to about 156 nm, as one non-limiting illustrative example. In this way, the volume at the opening at the top of the trench will be increased, which will effectively allow for more material to be deposited and reflowed therein to completely seal the trench. It should be understood by those of skill in the art that the curvature 26 can be adjusted by temperature and gas flow. For example, the radius of curvature and the critical dimension between the curved silicon at the top of trenches 22 can be increased by increasing the temperature and with adding $H_2$ the required temperature for certain curvatures is reduced. (It should be noted that the FIGS. 2A-2D and FIG. 3 show the rounded top 26 of the trench for simplicity; the rounded top 26, as described above, is optional and it is envisioned for the embodiments of FIGS. 2A-2D and FIG. 3 without the rounded top.)

Figure 1G:
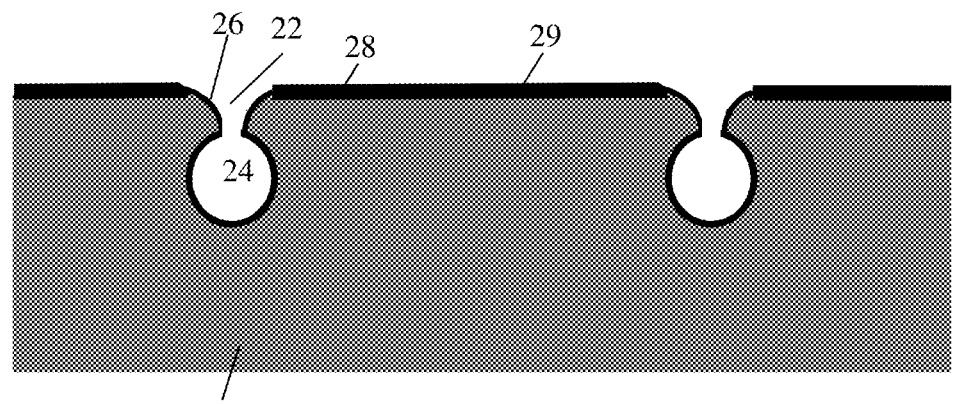

In FIG. 1G, a material 28 is deposited on the surface 29 of the substrate 12 including, e.g., the optional surface of the curvature 26, sidewalls of the trenches 22 and sidewalls of the cavity 24. In embodiments, the material 28 can be epitaxial SiGe deposited using ultra high vacuum CVD (UHVCVD); although other semiconductor materials, poly or epi films, and deposition processes are also contemplated herein. By way of example, SiGe material can be deposited at a temperature of about 600° C. to 750° C., resulting in a thickness of about 5 nm to about 50 nm. In embodiments, 15 nm of SiGe is deposited at 650° C. and the trench width 22 is 120 nm. It should be understood that other thicknesses of the layer 28 can be applied, depending on the critical dimension of the trenches 22. In general, as the width of the trench 22 increases, the thickness of layer 28 to fill in the top of the trench 22 during the subsequent reflow anneal increases.

In embodiments, the Ge concentration of the SiGe can be about 5% to about 30%, as an example. In further embodiments, the Ge concentration of the SiGe is graded from 0% to the maximum percent and then graded back to 0%. In embodiments, the maximum percent of Ge can be about 20%. The SiGe will deposit on the exposed surfaces although the SiGe thickness in the sidewalls of the trench 22 could be thinner on planar surfaces 29 of the substrate as compared to sidewalls 26 and cavities 24, as shown in FIG. 1G.

Figure 1H:
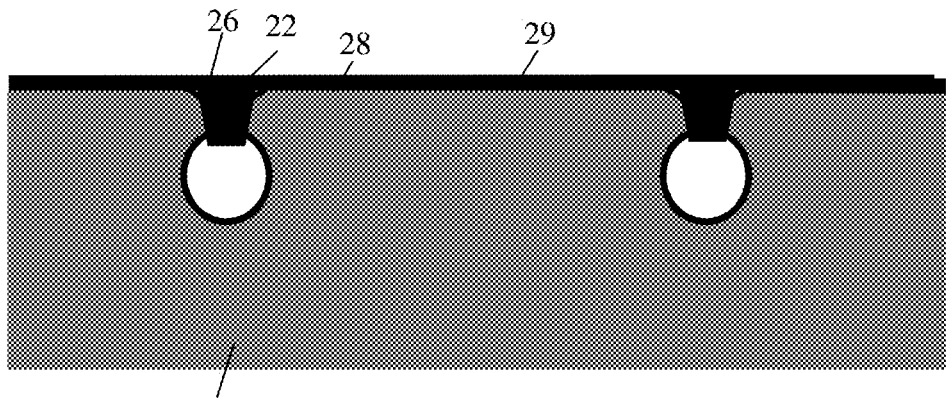

As shown in FIG. 1H, following the deposition of the material 28, the wafer is heated to equal to or greater than the reflow temperature of layer 28 so that layer 28 fills in the top of trench 22. Since SiGe has a lower reflow temperature than silicon, SiGe layer 28 can be reflowed into the opening of the trench 22 to plug or fill the top of the trench 22 without filling in the cavity 24. In embodiments, the reflow temperature is 800-1050° C. and the reflow time is anywhere up to about 600 seconds. In embodiments, the reflow temperature is 850° C. and the reflow time is 60 seconds.

Figure 1I:
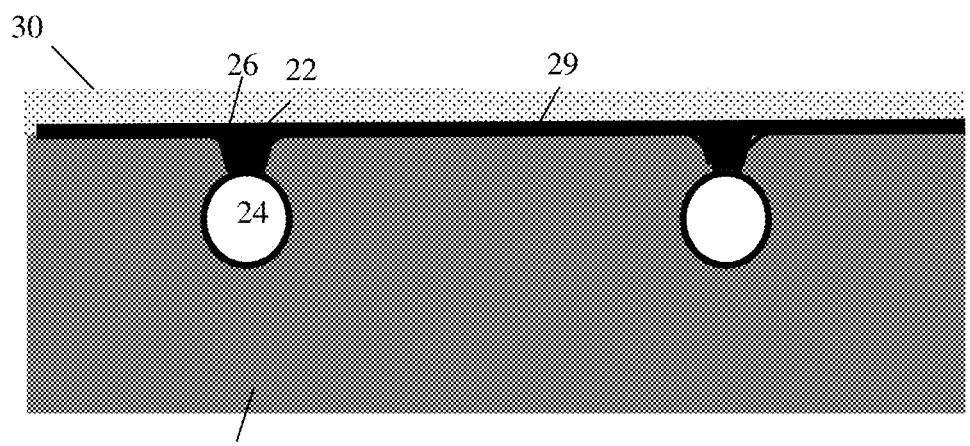

After layer 28 is reflowed, a semiconductor material 30 is deposited over the trenches 22 (and the remaining surface of the structure), including over the increased opening of the trench 22, as shown in FIG. 1I. In embodiments, the semiconductor material 30 can be a second trench sealing layer, e.g., Si material, deposited using an epi CVD process to either finishing sealing the trenches 22 or depositing additional material over the wafer surface 29 and trench top surface 22, thereby forming a cavity 24' (comprising the sealed trench and cavity).

In embodiments, the top of the trench 22 is fully sealed with SiGe layer 28 prior to silicon layer 30 deposition. In embodiments, the semiconductor material 30 can be deposited to a thickness of about 150 nm in a deposition chamber having a temperature of about 850° C. to about 1050° C. for about 60 seconds. At this temperature the SiGe material 28 will continue to reflow, continuing to gravitate or migrate into the upper portion of the trenches 22 (e.g., typically at the smallest critical dimension). The semiconductor material 30 may also reflow during the bake, filling in the increased volume at the top of the trench and resulting in a planar or nearly planar surface of the semiconductor material 30. This reflow will also assist in sealing the trenches 22, thereby forming the cavity 24'. In embodiments, the semiconductor layer 30 is Si. In additional embodiments, the semiconductor layer 30 does not reflow, resulting in a non-planar surface. In additional embodiments, the semiconductor layer 30 consists of a lower layer of SiGe and a lower layer of Si.

As shown in FIG. 1I, the surface of the reflowed SiGe material is flat and this shape can be controlled by SiGe layer 28 deposition temperature, Ge content, and thickness; the reflow temperature, time, and hydrogen or hydrogen-based gas flow; and temperature at which the semiconductor material 30 is deposited. It should also be noted that application of temperature during the reflow process will affect the size and shape of the cavity, e.g., which now forms the cavity 24'. In particular, the cavity 24 becomes a different shape, e.g., oval shape, slightly shrinking its volume compared to its original shape (see, e.g., FIG. 2D). If the cavity 24 is not sealed prior to silicon layer 28 deposition, then some of semiconductor layer 30 may deposit inside the cavity.

Figure 2A:
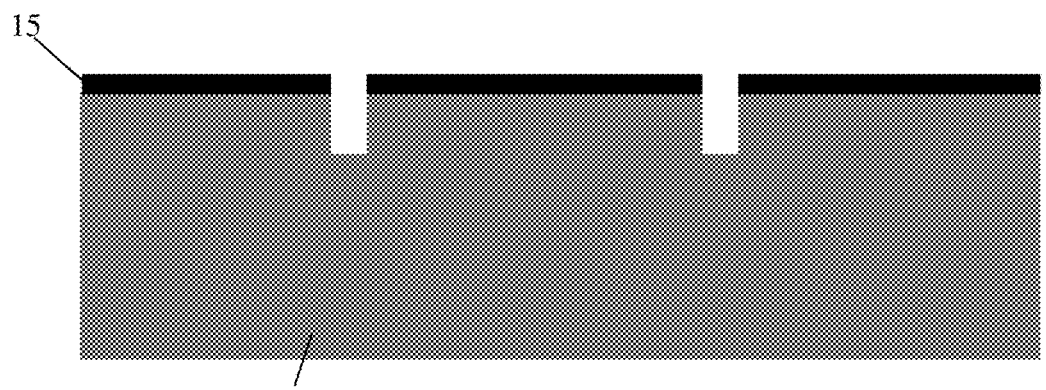
FIGS. 2A-2D show structures and respective fabrication processes in accordance with additional aspects of the present disclosure.

FIGS. 2A-2D show structures and respective fabrication processes in accordance with additional aspects of the present disclosure. In particular, FIGS. 2A-2D show a cavity 24' formed from the trenches 22, alone (without the cavity). More specifically, FIG. 2A shows pad dielectric(s) 15 deposited on the substrate 12, which can be a high resistivity substrate as already described herein. Trenches 22 are etched into the substrate 12 in the manner already described herein, e.g., by conventional lithography and etching processes. In one embodiment, the trenches are 120 nm wide and 0.7 micron deep.

Figure 2B:
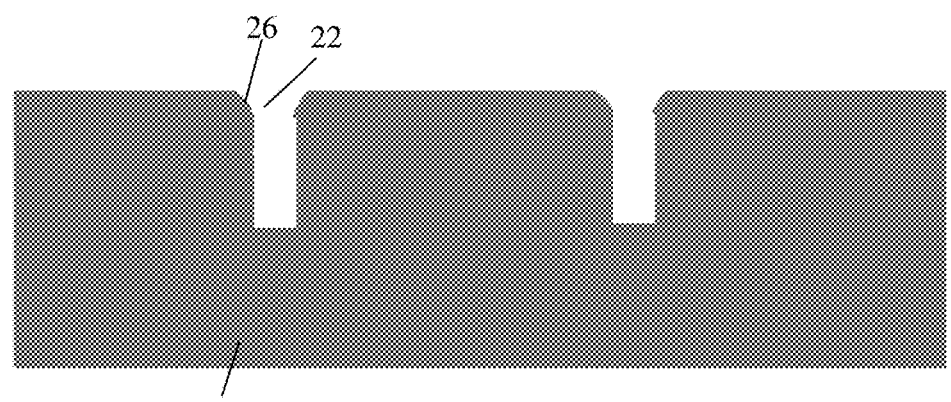

Referring to FIG. 2B, the pad dielectrics 15 are removed from the structure, exposing the upper surface of the substrate 12. In embodiments, the pad dielectrics 15 can be removed by a conventional etching process selective to such materials, e.g., using hot phosphorous chemistries. Following the removal of the pad dielectrics 15, the trenches 22 are subjected to an annealing process to soften or round (curved) the edges of the trenches, as shown representatively at reference numeral 26. As previously described, following an HF preclean process, the annealing process can be at 800° C. to about 1100° C. (and preferably about 650° C.) for 60 seconds in an $H_2$ atmosphere (with or without other gases bonded thereto). As previously described, the curvature 26 can increase the critical dimension of the top of the trench 22 by approximately about 20% to 30% or more.

Figure 2C:
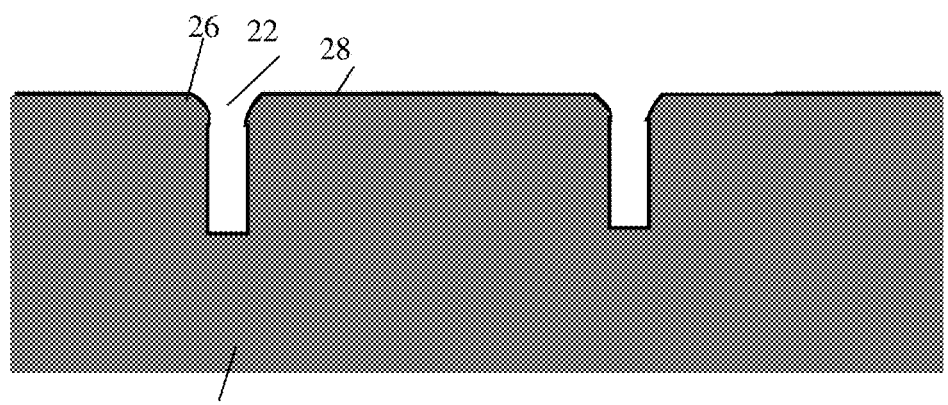

In FIG. 2C, material 28 is deposited on the surface of the substrate 12 including the surfaces of the curvature 26 and sidewalls and bottom of the trenches 22. In embodiments, the material 28 can be SiGe deposited at a temperature of about 650° C., resulting in a thickness of about 5 nm to about 10 nm, as an example. In embodiments, the germanium concentration of the SiGe can be about 5% to about 30%, as an example.

Figure 2D:
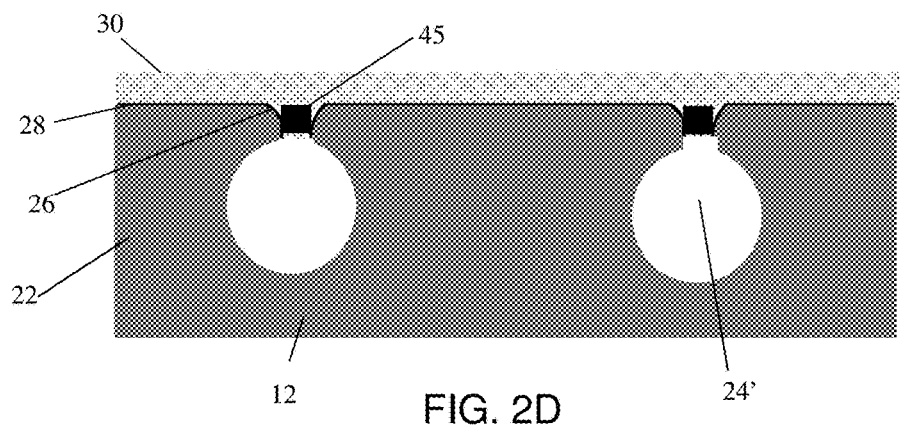

As shown in FIG. 2D, semiconductor material 30, e.g., Si material, is deposited over the trenches 22 (and, more particularly over the material 28) to seal the trenches 22, forming cavity 24'. In embodiments, the semiconductor material 30 is deposited to a thickness of about 150 nm in a deposition chamber having a temperature of about 850° C. to about 1050° C. for about 60 seconds. At this temperature, the SiGe material will reflow, gravitating or migrating into the upper portion of the trenches 22 (at the smallest critical dimension). The semiconductor material 30 will also reflow during the bake, resulting in a planar surface of the semiconductor material 30, which seals trenches 22 and forms the cavity 24'.

As further shown in FIG. 2D, the surface 45 of the reflowed SiGe material is flat and this shape can be controlled by temperature at which the semiconductor material 30 is deposited and a thickness of the SiGe material. It should also be noted that application of temperature during the reflow process will affect the size and shape of the trench, e.g., which now forms the cavity 24'. In particular, the trench (cavity) becomes a different shape, e.g., oval shape, slightly shrinking its volume compared to its original shape.

Figure 3:
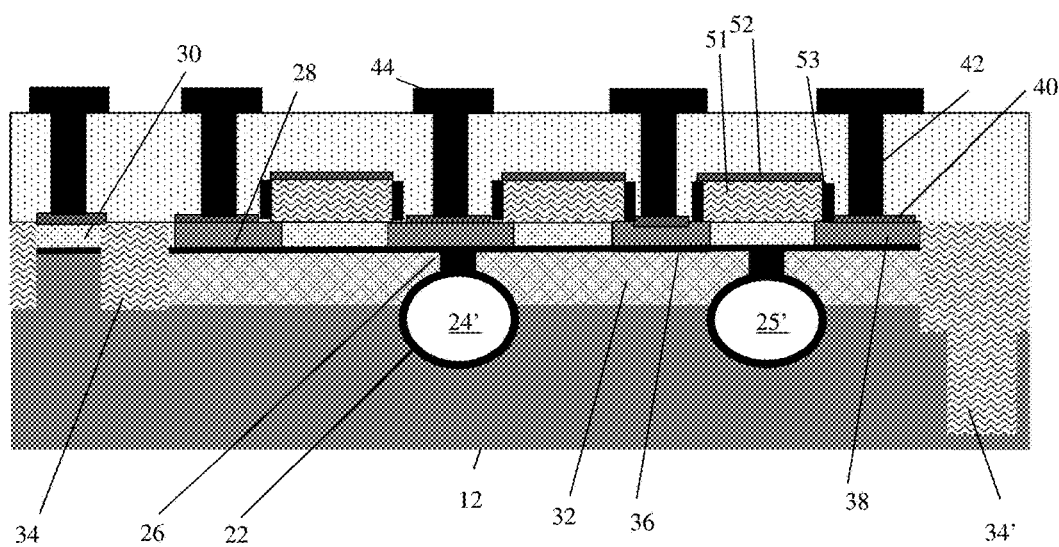
FIG. 3 shows devices formed above the cavities of FIG. 1H, amongst other features, and respective fabrication processes in accordance with aspects of the present disclosure.

FIG. 3 shows cross-sections of FET transistors formed on the epitaxial silicon planar or nearly planar surface of the semiconductor material 30, above the cavities 24', 25' of FIG. 1H (or FIG. 2D), amongst other features. Wire 44 and contact 42 are formed in dielectric 110 and are connected to FET source/drain 38. FET gate 51 is between the source/drains 38. Silicide 52 and 40 are formed over FET gate 51 an source/drain 38. Specifically cavity 24' is formed under the source or drain of the FET and the cavity 25' is formed under the gate. In embodiments, cavities are formed under both the source and drain of the FET; under the gate of the FET; or both. As shown in FIG. 3, the cavities 24' are formed in a well implant region 32 of the substrate 12. In embodiments, the well is a p-well for a NFET and a n-well for a PFET. In embodiments, the FET is a NFET switch with a p-well 32. In embodiments, the p-well 32 can be formed using conventional doping or ion implanting processes to, e.g., a depth of about 0.3 μm to about 3 μm. In embodiments, the cavities 24' and/or 25' touch the bottom of the source/drain junctions 38. In embodiments, the bottoms of source/drain depletion region touch the cavities 24' and/or 25. It is also contemplated that any of the following can be intersected by the cavities: a depletion region under the source/drain regions; a triple well (see, e.g., reference numeral 300 of FIGS. 4A-4D) under the FET; and a junction of the source/drain region (shown in FIGS. 4A-4D).

Moreover, in embodiments, the depletion regions from the wells 32 in the substrate 12 are kept inside the region surrounded by deep trench isolation structures 34. In embodiments, deep trench isolation structures 34 can be formed in the substrate 12 to completely isolate adjacent well region 32 and the RF devices 36 from DC substrate currents. In embodiments, the cavities 24' and 25' may be isolated from each other, connected to each other, or both.

Still referring to FIG. 3, as should also be understood by those of ordinary skill in the art, the transistors 36 can be formed by conventional CMOS processes on the planar surface of the semiconductor material 30. The transistors can be formed by deposition of gate dielectrics (e.g., high-k dielectrics such as Hafnium oxide, etc.), followed by gate metals (e.g., different work function metals), patterning of the materials using lithography and etching (e.g., reactive ion etching (RIE) to form the gate stacks, followed by sidewall formation, e.g., oxide or nitride materials deposited on the gate stacks). Source regions and drain regions 38 are formed within the substrate 12 (well region 32) or on the substrate 12 over the well region 32 (e.g., for raised source and drain regions) using conventional dopant or ion implantation processes such that no further explanation is required. In embodiments, an epitaxial growth process can be used to form the raised source and drain regions. The cavity structures 24' can be formed in the source/drain regions extending to a bottom of a PN junction under the transistors 36, e.g., touching the source/drain regions 38.

The source/drain regions 38 may contain transistor p-type halo, n-type extension implants, and n-type source/drain implants as known in the art. The n-type source/drain region can intercept the cavity 24' such that the pn junction area between the n-type source/drain and p-type p-well of the transistor is reduced. This reduction in the source/drain junction area will reduce the junction capacitance. Since the junction capacitance is non-linear with voltage, this reduction will improve the transistor linearity.

Silicide contacts 40 are formed on the source/drain regions 38 and over the cavity structures 24'. In embodiments, the silicide process begins with deposition of a thin transition metal layer, e.g., nickel, cobalt or titanium, over fully formed and patterned semiconductor devices (e.g., doped or ion implanted source and drain regions and respective devices 36). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts 40 in the active regions of the devices, e.g., devices. Subsequently formed contacts 42 will touch this silicided region 40 to make contact to the source/drain of the transistor 36. In embodiments, the cavities 24' (or cavities 25') are formed pre-silicide or, in some embodiments, between gate formation and silicide processes. Wiring layers and other back end of the line structures 44 are formed in contact with the contacts 42 using, again, conventional CMOS deposition and patterning processes.

The transistors 36 formed on the upper planar sealing layer 30 may include switches, e.g., multifinger NFET switch, PFET switch etc., formed above the cavities 24'. In further embodiments, the transistors 36 can be active RF devices, e.g., RF switches, or other active or passive device, with, in embodiments, a bias that is different than the substrate bias. The transistors 36 can be formed using multiple gates in an array of alternating source/drain/source/drain/, etc. configuration, as is known in the art. In addition, multiple stacks of multi-finger transistors can be placed, as known in the art. The transistors 36 can also have body contacts formed inside the ring of deep trench isolation 34, formed using any standard device layout as known in the art.

Figure 4A:
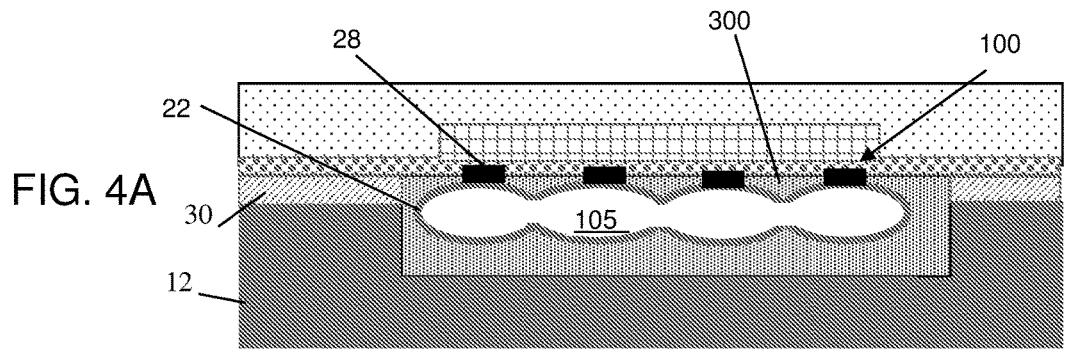
FIG. 4A shows a cross-sectional view of a vertical cut through the source/drain cavity 100 shown in FIG. 4.
Figure 4B:
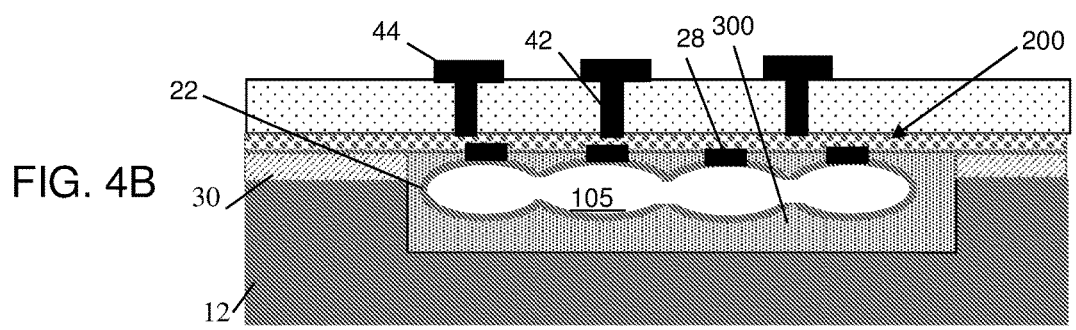
FIG. 4B shows a cross-sectional view of a vertical cut through the gate cavity shown in FIG. 4.
Figure 4C:
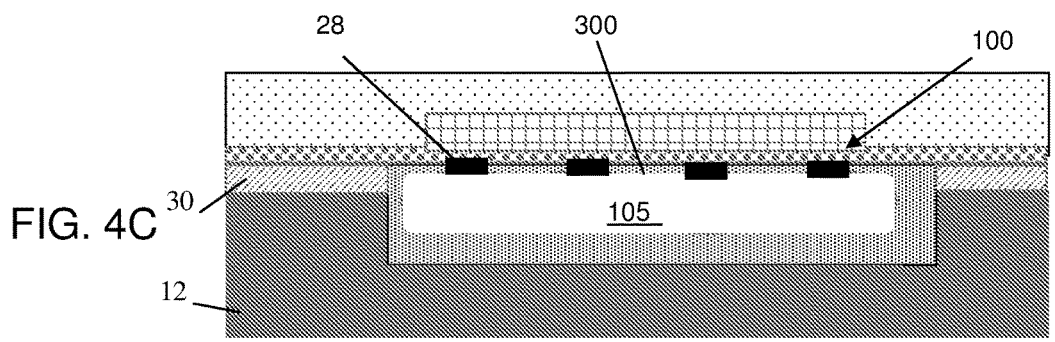
FIG. 4C shows a cross-sectional view of a vertical cut through the source/drain cavity shown in FIG. 4 with increases cavity reflow.
Figure 4D:
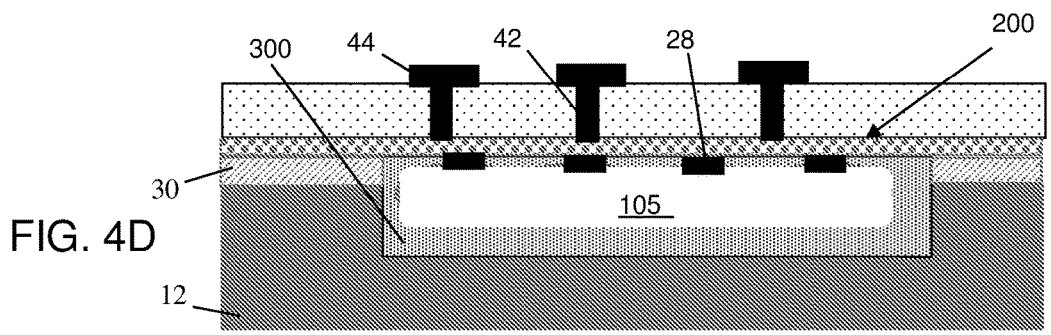
FIG. 4D shows a cross-sectional view of a vertical cut through the gate cavity shown in FIG. 4 with increases cavity reflow.
Figure 4:
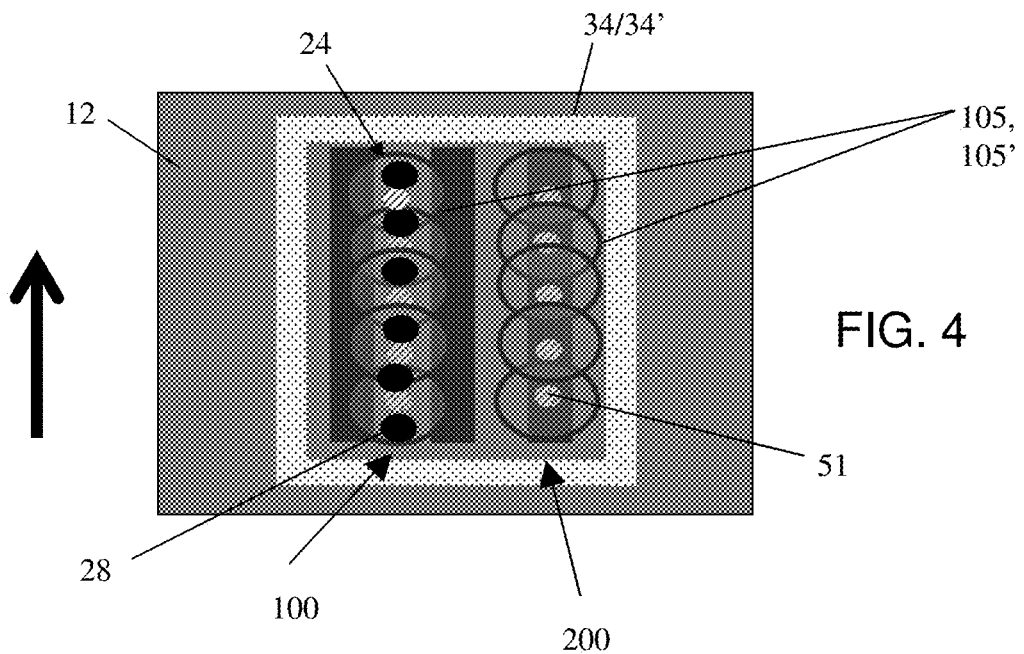
FIG. 4 shows a top view of a FET with cavities under the source or drain and cavities under the gate, and respective fabrication processes in accordance with aspects of the present disclosure.

FIG. 4 shows a top view of a FET with cavities 105 under the source or drain regions 100 and cavities 105' under the gate structure 200. When the cavities 105 are formed as shown in FIG. 1D, they may be isolated, i.e., not touch each other, or the cavities 105 can be connected as shown in FIG. 4 (and FIGS. 4A-4D), where they are connected in the direction parallel to the FET gate and source/drain. If the cavities 105 are connected, then they form a continuous cylindrical cavity under the FET source/drain, gate, or both.

FIG. 4A shows a cross-sectional view of a vertical cut through of the cavity 105 through the gate 200 shown in FIG. 4; and 4 FIG. 4B shows a cross-sectional view of a vertical cut through the cavity 105 through the source/drain 100 shown in FIG. 4. In these cases, the cavity layout and etch diameter caused the cavities 105 to connect parallel to the source/drain/gate but not connect perpendicular to the source/drain/gate. In embodiments, cavities 105 could be formed to connect (merged) under the source/drain/gate of the FET (not shown). The connected cavities 105 shown in FIGS. 4A and 4B are shown not fully reflowed. In embodiments, the cavity sealing process temperature or epi silicon deposition temperature could be high enough to cause the cavities to reflow in a planar fashion, as shown in FIGS. 4C and 4D, which are analogous to FIGS. 4A and 4B but with increased cavity reflow resulting in smooth cavity walls.

Figure 5:
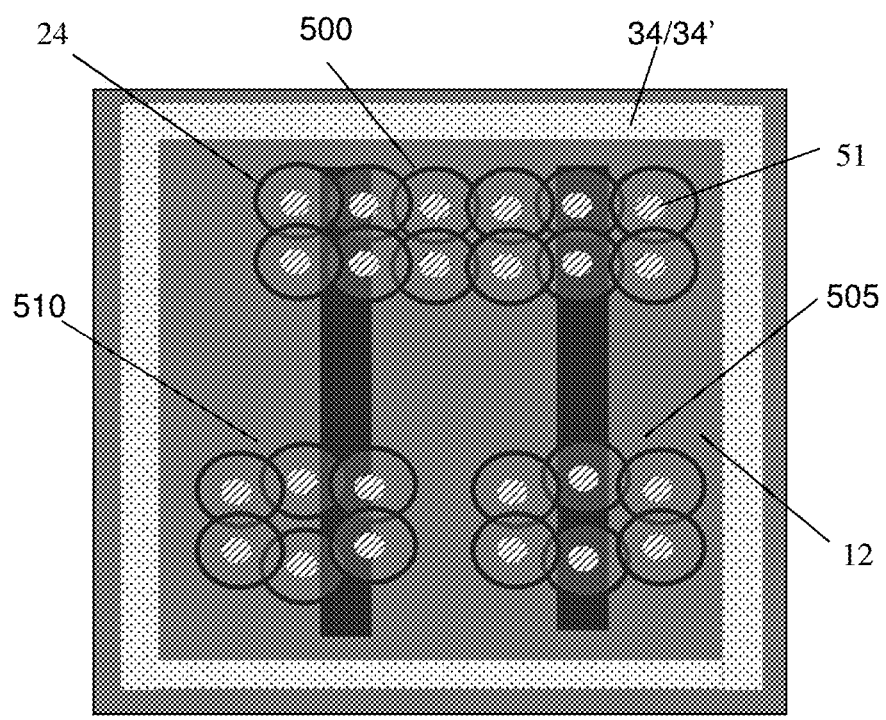
FIG. 5 shows a top view of an embodiment with the cavities 110 under both the FET source/drain and gate.

FIG. 5 shows a top view of an embodiment with the cavities 110 under both the FET source/drain and gate. In embodiment represented by reference numeral 500, the cavities are connected in the X and Y directions but a region of silicon to the left and right of each gate remains. In embodiments represented by reference numerals 505, 510, the cavity pitch under the gate is greater (as shown by reference numeral 505) than the cavity pitch under the source/drain and there is a region of silicon that remains both under the gate and under the source/drain (as shown by reference numeral 505). In embodiments, the cavity pitch under the gate is lesser (as shown by reference numeral 510) than the cavity pitch under the source/drain and there is a region of silicon that remains both under the gate and under the source/drain as shown by reference numeral 510. For these embodiments shown in FIG. 5, a larger area of silicon under the FET is removed. In embodiments not shown, the cavity connects both in the X and Y direction and extends to the deep trench isolation 34 (not shown) or 34' (shown).

Accordingly, as should now be understood by those of skill in the art and as shown in the figures or combinations of these figures (as each of the final structures shown herein can be combined to form one or more chips), the cavity can be: (i) only under a source region and a drain region of a gate structure; (ii) under a source region and extends under a gate structure on the planar surface; (iii) only under a gate structure; (iv) under gate structure and extends partially under source/drain regions of the gate structure. In addition, a depletion region under source/drain regions of the gate structure can be intersected by the cavity. The triple well under the gate structure can also be intersected by the cavity.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a cavity formed in a substrate material, the cavity being covered with epitaxial material that has an upper planar surface, wherein the cavity comprises a trench which includes a curvature at its open end and which is under a transistor.

2. The structure of claim 1, further comprising a trench which extends from the cavity to a surface of the substrate material, wherein the cavity is under the trench.

3. The structure of claim 1, wherein the epitaxial material is a reflowed SiGe material and upper Si sealing layer.

4. The structure of claim 3, further comprising a transistor formed on the upper planar surface of the Si sealing layer, above the cavity.

5. The structure of claim 1, wherein the cavity is under a source region and a drain region of a gate structure on the planar surface.

6. The structure of claim 1, wherein the cavity is under source and drain regions extending partially but not completely under the gate on the planar surface.

7. The structure of claim 1, wherein the cavity is only under a gate structure on the planar surface.

8. The structure of claim 1, wherein the cavity is under a gate structure on the planar surface and extends partially under source/drain regions of the gate structure.

9. The structure of claim 1, wherein a depletion region under source/drain regions of a gate structure on the planar surface is intersected by the cavity.

10. The structure of claim 1, wherein a triple well under the gate structure on the planar surface is intersected by the cavity.

11. The structure of claim 1, further comprising a plurality of cavities which are merged together and which are formed under a sealing layer and which are parallel and/or perpendicular to gate structures.

12. A structure comprising:
   a substrate material;
   a cavity formed in the substrate which includes a trench having a curved edge portion at its upper end;
   a first material within the trench which migrates to the upper end of the trench; and
   a second material which covers the first material and which covers the trench, the second material having a planar surface,
   wherein the first material is SiGe, the second material is Si material, the SiGe has a Ge concentration of about 5-30%, and after reflow, the SiGe has a top surface that is flat.

13. The structure of claim 12, wherein the first material has characteristics that allow it to reflow during the deposition of the Si material.

14. The structure of claim 12, further comprising a transistor formed on the planar surface of the second material.

15. A structure comprising:
   a substrate material;
   a cavity formed in the substrate which includes a trench having a curved edge portion at its upper end;
   a first material within the trench which migrates to the upper end of the trench; and
   a second material which covers the first material and which covers the trench, the second material having a planar surface;
   a gate structure with a source region and a drain region, wherein the cavity is under one of:
      only the source region and the drain region;
      the source region and the drain region and extends under the gate structure;
      only under the gate structure on the planar surface; and
      the gate structure and extends partially under the source region and the drain region.

* * * * *